(12) United States Patent
Morishita

(10) Patent No.: US 8,148,209 B2
(45) Date of Patent: Apr. 3, 2012

(54) RESIN EJECTION NOZZLE, RESIN ENCAPSULATION METHOD, AND ELECTRONIC PART ASSEMBLY

(75) Inventor: Seiichi Morishita, Hyogo (JP)

(73) Assignee: Ricoh Company, Ltd., Tokyo (JP)

( * ) Notice: Subject to any disclaimer, the term of this patent is extended or adjusted under 35 U.S.C. 154(b) by 1217 days.

(21) Appl. No.: 11/587,063

(22) PCT Filed: Mar. 14, 2006

(86) PCT No.: PCT/JP2006/005471
§ 371 (c)(1),
(2), (4) Date: Oct. 20, 2006

(87) PCT Pub. No.: WO2006/098459
PCT Pub. Date: Sep. 21, 2006

(65) Prior Publication Data
US 2009/0159319 A1    Jun. 25, 2009

(30) Foreign Application Priority Data
Mar. 17, 2005  (JP) ................................. 2005-076215

(51) Int. Cl.
*H01L 21/56* (2006.01)
(52) U.S. Cl. . 438/127; 438/124; 438/126; 257/E21.502; 118/303; 118/313; 118/321
(58) Field of Classification Search .................. 438/124, 438/126, 127; 425/110, 112, 117, 461, 90, 425/94, 95, 97; 264/272.11, 272.17; 257/E23.16, 257/E21.499, E21.502; 118/303, 321, 313, 118/46, 256, 300, 58, 63, 67, 68; 174/260; 427/58
See application file for complete search history.

(56) References Cited

U.S. PATENT DOCUMENTS

| 5,409,733 A | 4/1995 | Boger et al. |
| 5,720,820 A | 2/1998 | Boger et al. |
| 6,805,541 B1 * | 10/2004 | Hashimoto ................... 425/110 |
| 6,814,805 B2 * | 11/2004 | Park et al. ...................... 118/304 |
| 2003/0077083 A1 * | 4/2003 | Yamamoto et al. ........... 396/611 |

FOREIGN PATENT DOCUMENTS

| JP | 6-154691 | 6/1994 |
| JP | 2745207 | 2/1998 |
| JP | 10-116844 | 5/1998 |
| JP | 2000-176348 | 6/2000 |
| JP | 2001-259500 | 9/2001 |
| JP | 3343131 | 8/2002 |
| JP | 2003-309134 | 10/2003 |
| JP | 2004-24972 | 1/2004 |

* cited by examiner

*Primary Examiner* — Julio J Maldonado
(74) *Attorney, Agent, or Firm* — Cooper & Dunham LLP

(57) ABSTRACT

A resin ejection nozzle is scanned over a substrate on which an electronic part is mounted, and ejects an encapsulation resin to an encapsulation area of the substrate. The resin ejection nozzle comprises an ejection part adapted to eject the encapsulation resin, the ejection part having a longitudinal direction which is perpendicular to a direction of movement of the nozzle. An ejection hole part is adapted to cause the encapsulation resin to contact a substantially half area of a side of the electronic part which lies at right angles to the direction of movement of the nozzle. A remaining portion of the side of the electronic part is gradually contacted by the encapsulation resin after the substantially half area of the side of the electronic part is contacted by the encapsulation resin.

5 Claims, 7 Drawing Sheets

RESIN EJECTION NOZZLE, RESIN ENCAPSULATION METHOD, AND ELECTRONIC PART ASSEMBLY

TECHNICAL FIELD

This disclosure relates to a resin ejection nozzle which is scanned over a wiring substrate on which an electronic part is mounted and ejects an encapsulation resin to an encapsulation area of the wiring substrate. Moreover, the disclosure relates to a resin encapsulation method which ejects the encapsulation resin to the encapsulation area of the wiring substrate when the resin ejection nozzle is scanned over the wiring substrate, and relates to an electronic part assembly for which resin encapsulation is performed according to the resin encapsulation method.

In the present specification and claims, the term "electronic part" is used to be inclusive of any of electronic parts, such as resistors, thermistors, capacitors, etc., and also semiconductor device packages or bare-chip type semiconductor chips. Moreover, the term "wiring substrate" is used to be inclusive of lead frames of semiconductor device.

BACKGROUND ART

In the manufacturing processes of an electronic part assembly in which an electronic part, such as a semiconductor chip, a resistor, a thermistor or a capacitor, is mounted on a wiring substrate, resin encapsulation is performed in order to protect the mounted electronic part from the outside. See Japanese Laid-Open Patent Application No. 2003-309134, Japanese Patent No. 3343131, and Japanese Patent No. 2745207.

Generally, a resin ejection nozzle which has the cross-section in circular formation is used.

As disclosed in Japanese Laid-Open Patent Application No. 2003-309134, a method of applying encapsulation resin to a predetermined encapsulation area is known. When applying encapsulation resin to an encapsulation area of a wiring substrate, a resin ejection nozzle for applying a fluid-state encapsulation resin is used, and the resin ejection nozzle is scanned on the wiring substrate while the encapsulation resin is ejected from the resin ejection nozzle.

However, in the above-mentioned method, repetitive movement of the resin ejection nozzle over the encapsulation area must be carried out so that the resin is applied, and there is a problem that a long time is required for the resin application. Moreover, the mechanism for controlling the movement of the resin ejection nozzle or the wiring substrate is complicated, and it causes the manufacturing cost to be raised.

A conceivable method for solving the above problem may be a method of applying encapsulation resin using a resin ejection nozzle which is provided with a slotted ejection hole having a longitudinal direction perpendicular to the direction of movement of the nozzle, and the method using the resin ejection nozzle can apply encapsulation resin to a wide area.

However, when the above-mentioned resin ejection nozzle is used, the encapsulation resin ejected from the nozzle contacts the side surface of the electronic part as a whole simultaneously which is perpendicular to the direction of movement of the nozzle. After the resin application, air bubbles may be included in the part of the encapsulation resin near the electronic part, and the appearance becomes poor due to the air bubbles. And when the encapsulation resin is heated, the air bubbles will be expanded and a void will occur there. This causes the reliability to become poor.

SUMMARY

In an aspect of this disclosure, there is provided a resin ejection nozzle and a resin encapsulation method which can apply encapsulation resin to a wide encapsulation area of a wiring substrate on which an electronic part is mounted, while preventing inclusion of air bubbles.

In another aspect, there is provided an electronic part assembly in which the electronic part is encapsulated in the resin applied in accordance with the resin encapsulation method.

In another aspect, there is provided a resin ejection nozzle which is moved over a substrate on which an electronic part is mounted, and ejects an encapsulation resin to an encapsulation area of the substrate, the resin ejection nozzle comprising: an ejection part adapted to eject the encapsulation resin, the ejection part having a longitudinal direction which is perpendicular to a direction of movement of the nozzle; and an ejection hole part adapted to cause the encapsulation resin to contact a substantially half area of a side of the electronic part which lies at right angles to the direction of movement of the nozzle, wherein a remaining area of the side of the electronic part is gradually contacted by the encapsulation resin after the substantially half area of the side of the electronic part is contacted by the encapsulation resin.

The above-mentioned resin ejection nozzle may be configured so that a slotted ejection hole is arranged so that a central part of the slotted ejection hole in a longitudinal direction of the hole is curved to the direction of movement of the nozzle, and the curved central part causing the encapsulation resin to contact the substantially half area of the side of the electronic part which lies at right angles to the direction of movement of the nozzle.

The above-mentioned resin ejection nozzle may be configured so that a plurality of secondary ejection holes are arranged adjacent to a side of a slotted ejection hole which lies in the direction of movement of the nozzle, the plurality of secondary ejection holes causing the encapsulation resin to contact the substantially half area of the side of the electronic part which lies at right angles to the direction of movement of the nozzle.

The above-mentioned resin ejection nozzle may be configured so that each of the plurality of secondary ejection holes is configured so that a width of each of the plurality of secondary ejection holes in a longitudinal direction of each secondary ejection hole is smaller than a width of the slotted ejection hole in a longitudinal direction, and the longitudinal direction of each secondary ejection hole is slanted to the direction of movement of the nozzle.

The above-mentioned resin ejection nozzle may be configured so that the plurality of secondary ejection holes are arranged such that the encapsulation resin from each secondary ejection hole is caused to contact the substantially half area of the side of the electronic part.

The above-mentioned resin ejection nozzle may be configured so that a width of the ejection part in the longitudinal direction is slightly smaller than a width of the encapsulation area.

In another aspect of this disclosure, there is provided a resin encapsulation method which ejects an encapsulation resin to an encapsulation area of a substrate on which an electronic part is mounted, when a resin ejection nozzle is moved over the substrate, the resin encapsulation method comprising the steps of: providing a resin ejection nozzle comprising an ejection hole part and an ejection part adapted to eject the encapsulation resin, the ejection part having a longitudinal direction which is perpendicular to a direction of movement of the nozzle; causing the encapsulation resin to contact a substantially half area of a side of the electronic part which lies at right angles to the direction of movement of the nozzle; and causing the encapsulation resin to gradually contact a remaining area of the side of the electronic part after the substantially half area of the side of the electronic part is contacted by the encapsulation resin.

In another aspect, there is provided an electronic part assembly comprising: a wiring substrate; an electronic part; a plurality of electrodes provided on the wiring substrate and electrically connected to the electronic part; and an encapsulation resin provided in an encapsulation area of the wiring substrate to encapsulate the electronic part and the plurality of electrodes connected to the electronic part, wherein the encapsulation resin is formed in accordance with the above-mentioned resin encapsulation method.

According to the aforementioned resin ejection nozzle and resin encapsulation method, it is possible to apply encapsulation resin to a wide encapsulation area of a wiring substrate on which an electronic part is mounted, while preventing inclusion of air bubbles.

Since the resin encapsulation of the electronic part assembly is carried out in accordance with the aforementioned resin encapsulation method, it is possible to provide the electronic part assembly in which inclusion of air bubbles near the electronic part does not take place. It is possible to prevent the appearance of the electronic part assembly after the resin application from deteriorating due to the air bubbles. And it is possible to prevent the occurrence of the void when the encapsulation resin is heated, and the reliability can be increased.

The aforementioned and other aspects, features and advantages will be apparent from the following detailed description when read in conjunction with the accompanying drawings.

BEST MODE FOR CARRYING OUT THE INVENTION

A description will now be given of an embodiment of the invention with reference to the accompanying drawings.

Figure 1A:
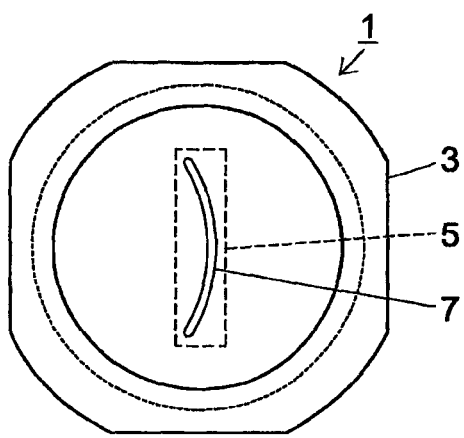
FIG. 1A, FIG. 1B and FIG. 1C are diagrams showing the composition of a resin ejection nozzle in an embodiment of the invention.
Figure 1B:
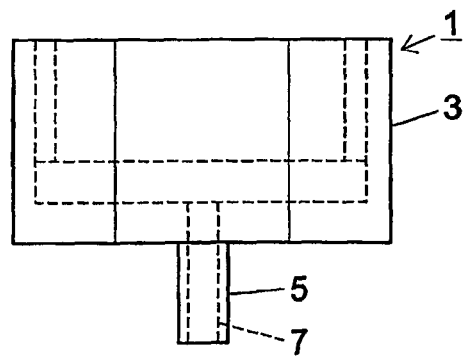
Figure 1C:
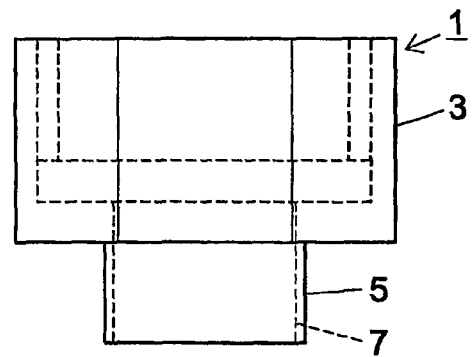

FIG. 1A, FIG. 1B and FIG. 1C show the composition of a resin ejection nozzle in an embodiment of the invention. FIG. 1A is a plan view of the resin ejection nozzle, FIG. 1B is a front view of the resin ejection nozzle, and FIG. 1C is a right side view of the resin ejection nozzle.

In the resin ejection nozzle 1 of this embodiment, a nozzle body 2 which is made of stainless steel is provided. The nozzle body 3 of stainless steel, provided in the resin ejection nozzle 1, is in a generally cylindrical shape and provided with a bottom. A screw thread for connecting the nozzle body 3 with a resin supply portion, such as a cylinder, is formed in an inner wall of the nozzle body 3 which is opposite to the bottom of the nozzle body 3.

An ejection part 5 which is made of stainless steel is formed on the bottom of the nozzle body 3 so that the ejection part 5 projects downwardly from the bottom of the nozzle body 3. A slotted ejection hole 7 which penetrates the bottom of the nozzle body 3 and the ejection part 5 is formed and this ejection hole 7 has a horizontal cross-section which is in the shape of a slot. The slotted ejection hole 7 is formed so that the central part of the hole 7 in the longitudinal direction is curved to the direction of movement of the resin ejection nozzle 1 which direction is perpendicular to the longitudinal direction of the slotted ejection hole 7.

For example, the bottom-end dimensions of the slotted ejection hole 7 in the ejection part 5 are as follows. The opening of the slotted ejection hole 7 is about 0.3 mm wide, the width of the slotted ejection hole 7 in the transverse direction is set to about 1.8 mm, the width of the slotted ejection hole 7 in the longitudinal direction is set to about 8.8 mm, and the radius of curvature of the slotted ejection hole 7 is set to about 8.6 mm.

Figure 2A:
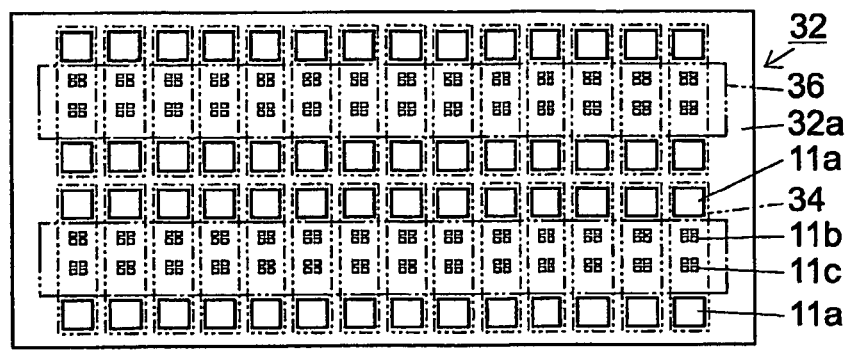
FIG. 2A, FIG. 2B and FIG. 2C are diagrams for explaining the manufacturing method of an electronic part assembly to which an embodiment of the resin encapsulation method of the invention is applied.
Figure 2B:
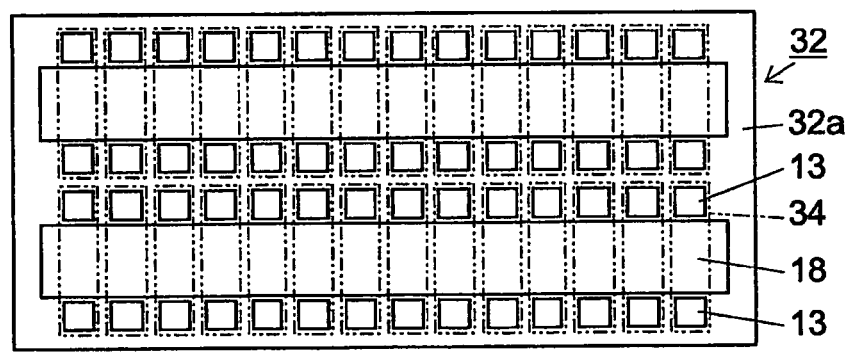
Figure 2C:
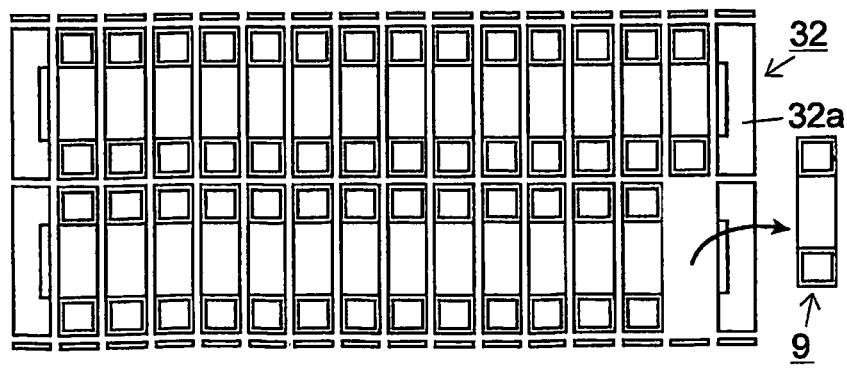
Figure 3:
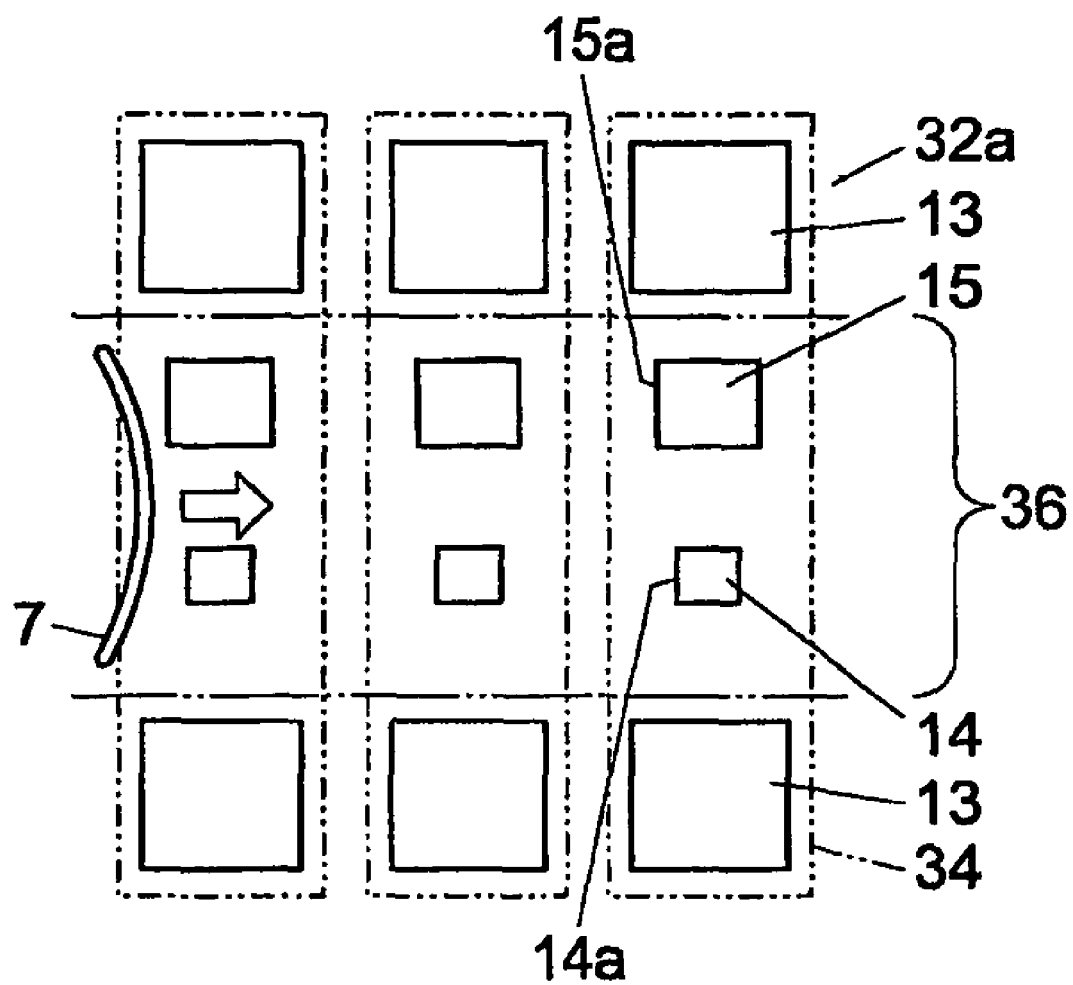
FIG. 3 is a plan view for explaining an embodiment of the resin encapsulation method of the invention.
Figure 4A:
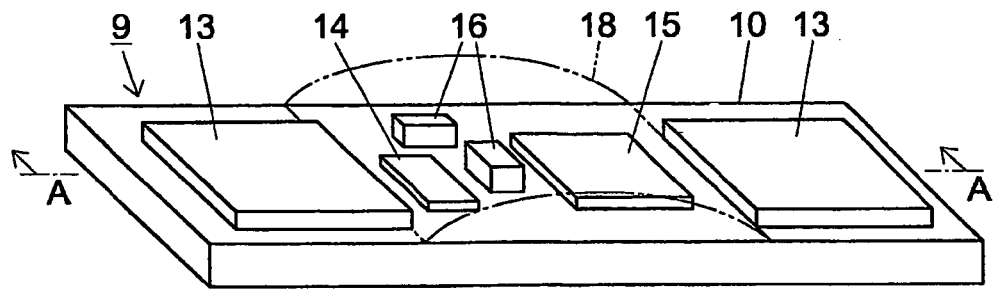
FIG. 4A, FIG. 4B and FIG. 4C are diagrams showing the composition of an embodiment of the electronic part assembly for which the resin encapsulation is performed according to an embodiment of the resin encapsulation method of the invention.
Figure 4B:
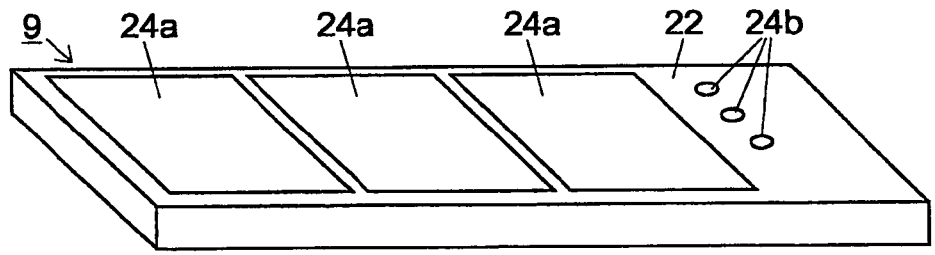
Figure 4C:
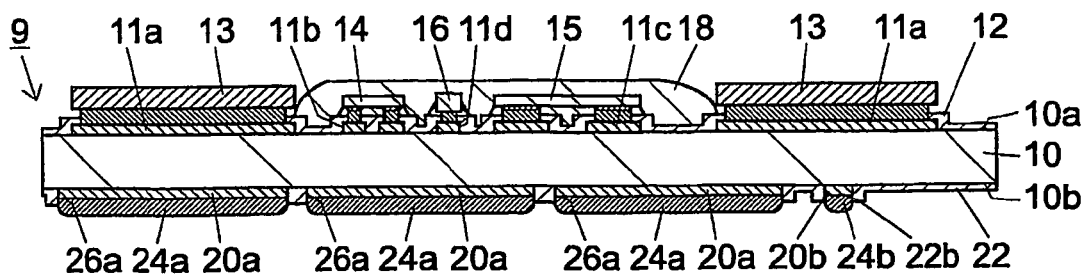

FIG. 2A, FIG. 2B and FIG. 2C are diagrams for explaining the manufacturing method of an electronic part assembly to which an embodiment of the resin encapsulation method of the invention is applied. FIG. 3 is a plan view for explaining an embodiment of the resin encapsulation method of the invention. FIG. 4A, FIG. 4B and FIG. 4C show the composition of an embodiment of the electronic part assembly for which the resin encapsulation is performed according to an embodiment of the resin encapsulation method of the invention. FIG. 4A is a perspective view of a front surface of the electronic part assembly, FIG. 4B is a perspective view of a back surface of the electronic part assembly, and FIG. 4C is a cross-sectional view of the electronic part assembly taken along the line A-A indicated in FIG. 4A.

In the resin encapsulation method of this embodiment, a protection circuit module of a secondary battery is assumed to be an example of the electronic part assembly as the encapsulation object for which the resin encapsulation is performed according to the resin encapsulation method.

The protection circuit module will be explained with reference to FIG. 4A through FIG. 4C.

The protection circuit module 9 comprises a wiring substrate 10. Two battery-side external terminals 11a, the plurality of electrodes 11b for a protection IC chip, the plurality of electrodes 11c for a field effect transistor chip, the plurality of electrodes 11d for electronic parts, and a wiring pattern (not illustrated) are formed on the front surface 10a of the wiring substrate 10 (see FIG. 4C).

The battery side external terminals 11a, the electrodes 11b for the protection IC chip, the electrodes 11c for the field effect transistor chip, the electrodes 11d for the electronic parts, and the wiring pattern are made of copper. The electrodes 11b for the protection IC chip, the electrodes 11c for the field effect transistor chip, and the electrodes 11d for the electronic parts are disposed between the two battery side external terminals 11a.

An insulating material layer 12 is formed on the front surface 10a of the wiring substrate 10. Opening portions corresponding to the battery side external terminals 11a, the electrodes 11b for the protection IC chip, the electrodes 11c for the field effect transistor chip, and the electrodes 11d for the electronic parts respectively are formed in the insulating material layer 12.

Metal plates 13 (for example, nickel plates) are disposed on the battery side external terminals 11a through the solder which is formed in the opening portions.

Face down bonding of a protection IC chip (electronic part) 14 which is in a bare chip state is carried out in the areas where the electrodes 11b for the protection IC chip are formed. The protection IC chip 14 is connected with the electrodes 11b for the protection IC chip by the solder and mounted on the wiring substrate 10.

Face down bonding of a field effect transistor chip (electronic part) 15 which is in a bare chip state is carried out in the areas where the electrodes 11c for the field effect transistor chip are formed. The field effect transistor chip 15 is connected with the electrodes 11c for the field effect transistor chip by the solder and mounted on the wiring substrate 10. For example, the field effect transistor chip 15 contains two field-effect transistors which are connected in series.

The electronic parts 16 are mounted in the areas where the electrodes 11d for the electronic parts are formed. For example, the electronic parts 16 may contain thermistor elements, such as PTC elements, resistors, capacitors, etc. The electronic parts 16 are connected with the electrodes 11d for the electronic parts by the solder and mounted on the wiring substrate 10. The underfill which is made of a resin material is filled up between the protection IC chip 14 and the insulating material layer 12 and between the field effect transistor chip 15 and the insulating material layer 12, respectively. For example, the material of the underfill may contain an epoxy resin and a silicone resin. Some of the underfill portions contain silica particles, and other underfill portions do not contain any silica particles.

Tapered structure portions which are made of the underfill material are formed between the electronic parts 16 and the insulating material layer 12 and in the circumference of the electronic parts 16 including the neighboring solder for mounting the electronic parts 16, respectively.

An encapsulation resin 18 is formed in the areas of the insulating material layer 12 between the two nickel plates 13 including the mounting area of the protection IC chip 14, the mounting area of the field effect transistor chip 15, and the mounting areas of the electronic parts 16. The protection IC chip 14, the field effect transistor chip 15, and the electronic parts 16 are covered with and protected by the encapsulation resin 18.

Three load side external terminals 20a and the plurality of testing terminals 20b are formed on the back surface 10b of the wiring substrate 10. The back surface 10b is opposite to the front surface 10a of the wiring substrate 10. The load side external terminals 20a and the testing terminals 20b are made of copper.

An insulating material layer 22 is formed on the back surface 10b of the wiring substrate 10. Openings 22a corresponding to the load side external terminals 20a and openings 22b corresponding to the testing terminals 20b are formed in the insulating material layer 22. Gold plating layers 24a are formed on the surfaces of the load side external terminals 20a, and gold plating layers 24b are formed on the surfaces of the testing terminals 20b.

Next, the manufacturing method of the electronic part assembly to which an embodiment of the resin encapsulation method of the invention is applied will be explained with reference to FIG. 2A through FIG. 3.

In FIG. 3, only the slotted ejection hole 7 is illustrated about the resin ejection nozzle.

(1) A cluster board 32 in which a plurality of rectangular wiring substrate areas 34 are formed is prepared. In this example of the cluster board 32, two wiring substrate areas 34 are arrayed in rows in the transverse direction of the cluster board 32, and fourteen wiring substrate areas 34 are arrayed in columns in the longitudinal direction of the cluster board 32. There are a total of 28 wiring substrate areas 34 contained in the cluster board 32.

The two battery side external terminals 11a, the plurality of electrodes 11b for the protection IC chip, the plurality of electrodes 11c for the field effect transistor chip, the plurality of electrodes for the electronic parts (not illustrated), and the wiring pattern (not illustrated) are formed in each wiring substrate area 34 on the front surface 32a of the cluster board 32.

The encapsulation area 36 ranging over the 14 wiring substrate areas 34 arrayed in the longitudinal direction is formed. The width of the encapsulation area 36 in the transverse direction is slightly larger than the size of the slotted ejection hole 7 in the longitudinal direction of the resin ejection nozzle 1 of FIG. 1. For example, in the present embodiment, the size of the slotted ejection hole 7 in the longitudinal direction is 8.8 mm, and the width of the encapsulation area 36 in the transverse direction is 10 mm (see FIG. 2A).

(2) By using the solder (not illustrated), the nickel plates 13, the protection IC chip 14, the field effect transistor chip 15, and the electronic parts (not illustrated) are mounted on the battery side external terminals 11a, the electrodes 11b for the protection IC chip, and the electrodes 11c for the field effect transistor chip, respectively.

The underfill is formed in the mounting areas of the protection IC chip 14 and the field effect transistor chip 15. While the encapsulation resin is ejected from the slotted ejection hole 7 of the above-described resin ejection nozzle 1 of FIG. 1, the resin ejection nozzle 1 is scanned, in the direction indicated by the arrow in FIG. 3, over the encapsulation area 36, so that the encapsulation resin 18 is continuously applied and cured in the longitudinal direction of the cluster board 32. See FIG. 2B and FIG. 3.

As shown in FIG. 1A and FIG. 3, the resin ejection nozzle 1 has the slotted ejection hole 7 in which the central part of the hole 7 in the longitudinal direction is curved to the direction of movement (the direction of an arrow) of the resin ejection nozzle 1 (which direction is indicated by the arrow in FIG. 3). For example, at the time of application of the encapsulation resin in the area near the protection IC chip 14, the encapsulation resin being ejected first contacts the central portion of the side 14a of the protection IC chip 14 which lies at right angles to the direction of movement of the nozzle. And the encapsulation resin is caused to gradually contact the outward portions of the side 14a of the protection IC chip 14 within the wiring substrate area 34 as the resin ejection nozzle 1 is moved in the direction indicated by the arrow in FIG. 3.

Similarly, at the time of application of the encapsulation resin in the area near the field effect transistor chip 15, the encapsulation resin being ejected first contacts the central portion of the side 15a of the field effect transistor chip 15 which lies at right angles to the direction of movement of the nozzle. And the encapsulation resin is caused to gradually contact the outward portions of the side 15a of the field effect transistor chip 15 within the wiring substrate area 34 as the resin ejection nozzle 1 is moved in the direction indicated by the arrow in FIG. 3.

Although illustration is omitted, the same discussion is also applicable to the electronic parts 16 mounted in the wiring substrate area 34.

Accordingly, when the encapsulation resin is applied from the resin ejection nozzle to the wiring substrate on which the electronic parts are mounted, it is possible to prevent inclusion of air bubbles near the side 14a of the protection IC chip 14 the side 15a of the field effect transistor chip 15, and the sides of the electronic parts which lie at right angles to the direction of movement of the nozzle. And the resin ejection nozzle 1 is provided with the slotted ejection hole 7 which is extended in the longitudinal direction which is perpendicular to the direction of movement of the nozzle, and the encapsulation resin can be applied to a wide encapsulation area of the wiring substrate.

Moreover, the width of the slotted ejection hole 7 in the longitudinal dimension of the nozzle 1 is slightly smaller than the width of the encapsulation area 36 in the transverse direction. By making one scanning of the resin ejection nozzle 1 over the cluster board 32, it is possible to apply the encapsulation resin to the whole encapsulation area 36 ranging over the number of wiring substrate areas 34. According to the resin encapsulation method of the present embodiment, repetitive movement of the nozzle over the encapsulation area as in the conventional method is no longer necessary to perform, and the time for the resin application can be shortened when compared with the case in which the encapsulation resin is applied repeatedly by the repetitive movement of the nozzle over the encapsulation area.

Moreover, when the encapsulation resin is applied repeatedly as in the conventional method, unevenness may be formed in the encapsulation resin surface after the resin application, and a stripe-like defect on the appearance may take place. However, according to the resin encapsulation method of the present embodiment, it is possible to prevent the stripe-like defect on the appearance from taking place in the surface of the encapsulation resin 18 applied to the whole encapsulation area 36.

(3) The adhesive dicing tape is attached to the back surface of the cluster board 32. By performing the known dicing process on the front surface 32a of the cluster board 32, the areas of the cluster board 32 between the wiring substrate areas 34 are cut away, so that the individual protection circuit modules 9 are created. Then, the dicing tape is pulled in the several directions to make the individual protection circuit modules 9 to be separated from each other. Moreover, ultraviolet ray irradiation is applied to the dicing tape, and the adhesion power of the dicing tape is weakened. One of the protection circuit modules 9 is pushed up by using a rod-like fixture from the back surface of the dicing tape, and the protection circuit module 9 is taken out by using a vacuum suction with a pickup fixture. See FIG. 2C.

Figure 5A:
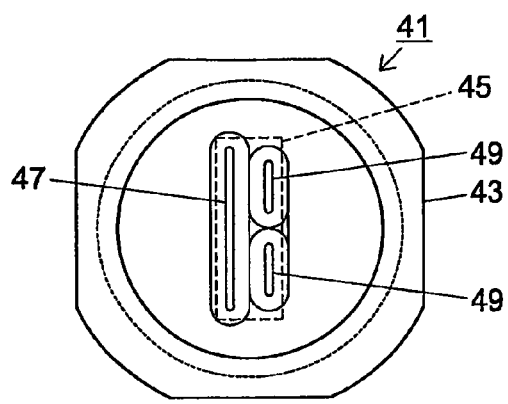
FIG. 5A, FIG. 5B and FIG. 5C are diagrams showing the composition of another embodiment of the resin ejection nozzle of the invention.
Figure 5B:
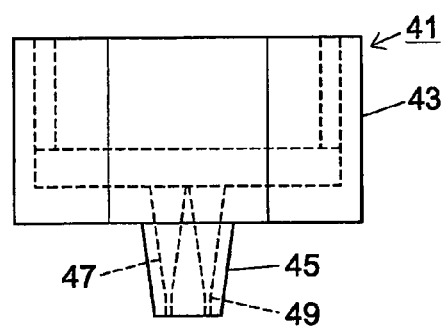
Figure 5C:
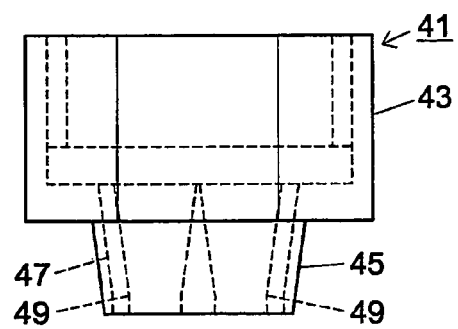

FIG. 5A, FIG. 5B and FIG. 5C show the composition of another embodiment of the resin ejection nozzle of the invention. FIG. 5A is a plan view of the resin ejection nozzle, FIG. 5B is a front view of the resin ejection nozzle, and FIG. 5C is a right side view of the resin ejection nozzle.

In the resin ejection nozzle 41 of this embodiment, a nozzle body 43 which is made of stainless steel is provided. The nozzle body 43 of stainless steel, provided in the resin ejection nozzle 41, is in a generally cylindrical shape and provided with a bottom. A screw thread for connecting the nozzle body 43 with a resin supply portion, such as a cylinder, is formed in an inner wall of the nozzle body 43 which is opposite to the bottom of the nozzle body 43.

An ejection part 45 which is made of stainless steel is formed on the bottom of the nozzle body 43 so that the ejection part projects downwardly from the bottom of the nozzle body 43. A slotted ejection hole 47 which penetrates the bottom of the nozzle body 43 and the ejection part 45 is formed, and this ejection hole 47 has a horizontal cross-section which is configured into a slot formation. The slotted ejection hole 47 is formed so that it has a longitudinal direction which is perpendicular to the direction of movement of the nozzle 41.

Two secondary ejection holes 49 which penetrate the bottom of the nozzle body 43 and the ejection part 45 are formed so that they are located adjacent to the side of the slotted ejection hole 47 which lies in the direction of movement of the nozzle 41. The secondary ejection holes 49 are arranged such that the encapsulation resin ejected from the secondary ejection holes 49 is caused to contact the substantially half area of the electronic-part side of the wiring substrate (which is the encapsulation object) which lies at right angles to the direction of movement of the nozzle 41.

For example, the bottom-end dimensions of the slotted ejection hole 47 and the secondary ejection holes 49 in the ejection part 45 are as follows. The opening of the slotted ejection hole 47 is about 0.3 mm wide, and the width of the slotted ejection hole 47 in the longitudinal direction is about 8.8 mm. The opening of each of the secondary ejection holes 49 is about 0.3 mm wide, and the width of each of the secondary ejection holes 49 in the longitudinal direction is about 2.7 mm. The distance between the slotted ejection hole 47 and each of the secondary ejection holes 49 in the transverse direction is about 1.7 mm, and the distance between the two secondary ejection holes 49 in the longitudinal direction is about 1.8 mm.

In this embodiment, the slotted ejection hole 47 and the secondary ejection holes 49 are tapered so that the bottom-end diameter of each of the ejection holes 47 and 49 is smaller than the top-end diameter thereof. The taper angle in this embodiment is about 15 degrees.

Figure 6:
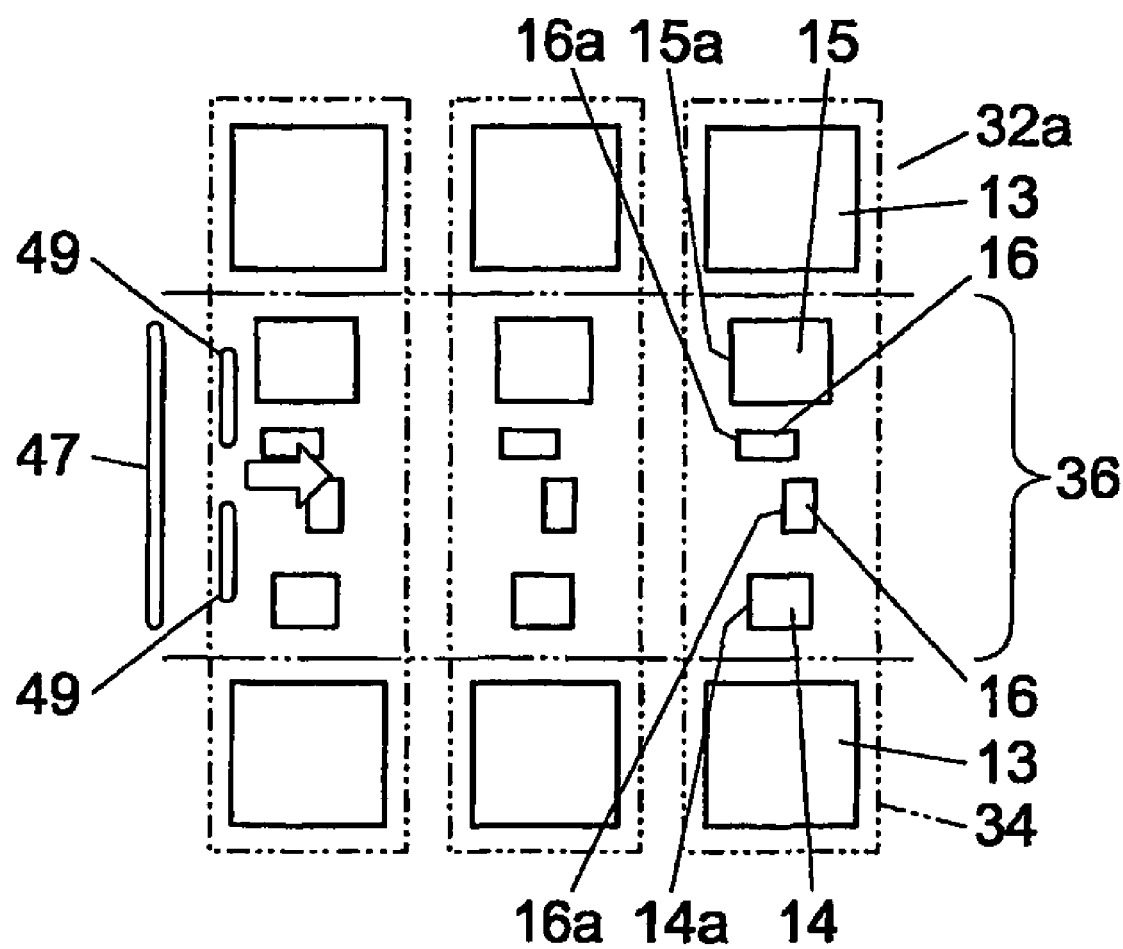
FIG. 6 is a plan view for explaining another embodiment of the resin encapsulation method of the invention.

FIG. 6 is a plan view for explaining another embodiment of the resin encapsulation method of the invention.

Similar to the previous embodiment of FIG. 3, the object of resin encapsulation is the encapsulation area 36 of the cluster board 32. However, the arrangement of the protection IC chip 14, the field effect transistor chip 15 and the electronic part 16 in FIG. 6 differs from that in the previous embodiment of FIG. 3.

The electronic part assembly formed from the cluster board 32 is the same as that of the protection circuit module of the secondary battery explained above with reference to FIG. 4A-4C. Next, the resin encapsulation method in this embodiment will be explained with reference to FIG. 5A-5C and FIG. 6.

By using the solder (not illustrated), the nickel plates 13, the protection IC chip 14, the field effect transistor chip 15, and the electronic parts 16 are mounted on the battery side external terminals, the electrodes for the protection IC chip, and the electrodes for the field effect transistor chip which are provided on the front surface 32a of the wiring substrate area 36 of the cluster board 32.

While the encapsulation resin is ejected from the slotted ejection hole 47 and the secondary ejection holes 49 of the above-described resin ejection nozzle 41 of FIG. 5A, the resin ejection nozzle 41 is scanned, in the direction indicated by the arrow in FIG. 6 (which direction is parallel to the transverse direction of each wiring substrate area 34), over the encapsulation area 36, so that the encapsulation resin 18 is continuously applied and cured in the longitudinal direction of the cluster board 32.

As shown in FIG. 5A and FIG. 6, the resin ejection nozzle 41 includes the slotted ejection hole 47 having its longitudinal direction perpendicular to the direction of movement of the nozzle. Moreover, the resin ejection nozzle 41 includes the secondary ejection holes 49 which are arranged in the position adjacent to the side of the slotted ejection hole 47 which lies in the direction of movement of the nozzle 41. The encapsulation resin ejected from the secondary ejection holes 49 is caused to contact the substantially half area of the side 14a of the protection IC chip 14, the substantially half area of the side 15a of the field effect transistor chip 15, and the substantially half area of the side 16a of each electronic part 16, which lie perpendicular to the direction of movement of the nozzle 41.

Thereby, at the time of the resin application, the encapsulation resin ejected from the secondary ejection holes 49 of the nozzle 41 is caused to contact the substantially half area of the side 14a of the protection IC chip 14 which lies at right angles to the direction of movement of the nozzle 41. And, when the resin ejection nozzle 41 is moved in the direction of the arrow in FIG. 6, the encapsulation resin ejected from the slotted ejection hole 47 is caused to contact the remaining half area of the side 14a of the protection IC chip 14. Similarly, the encapsulation resin ejected from the secondary ejection holes 49 of the nozzle 41 is caused to contact the substantially half area of the side 15a of the field effect transistor chip 15 and the substantially half area of the side 16a of each electronic part 16 which lie at right angles to the direction of movement of the nozzle 41. Thereafter, the encapsulation resin ejected from the slotted ejection hole 47 is caused to contact the remaining half area of the side 15a of the field effect transistor chip 15 and the remaining half area of the side 16a of each electronic part 16.

Accordingly, when the encapsulation resin is applied from the resin ejection nozzle 41 to the wiring substrate on which the electronic parts are mounted, it is possible to prevent inclusion of air bubbles near the side 14a of the protection IC chip 14, the side 15a of the field effect transistor chip 15, and the side 16a of each of the electronic parts 16, which lie at right angles to the direction of movement of the nozzle 41.

And the resin ejection nozzle 41 is provided with the slotted ejection hole 47 which is extended in the longitudinal direction which is perpendicular to the direction of movement of the nozzle 41, and the encapsulation resin can be applied to a wide encapsulation area of the wiring substrate.

Moreover, the width (=8.8 mm) of the slotted ejection hole 47 in the longitudinal direction of the nozzle 41 is slightly smaller than the width (=10 mm) of the encapsulation area 36 in the transverse direction. By making one scanning of the resin ejection nozzle 41 over the cluster board 32, it is possible to apply the encapsulation resin to the whole encapsulation area 36 ranging the number of wiring substrate areas 34. And the time for the resin application time can be shortened when compared with the case in which the encapsulation resin is applied repeatedly by the repetitive movement of the nozzle over the encapsulation area. According to the resin encapsulation method of the present embodiment, it is possible to prevent the stripe-like defect on the appearance from taking place on the surface of the encapsulation resin 18 applied to the encapsulation area 36.

Figure 7A:
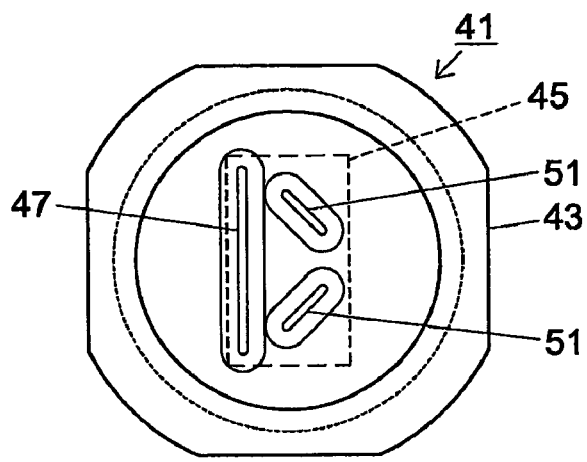
FIG. 7A, FIG. 7B and FIG. 7C are diagrams showing the composition of modifications of the resin ejection nozzle of the invention.
Figure 7B:
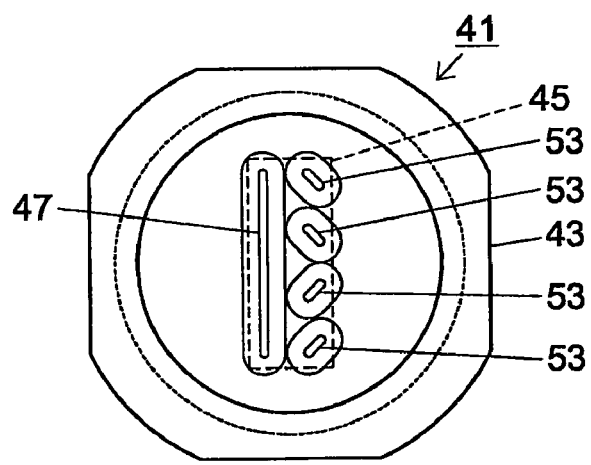
Figure 7C:
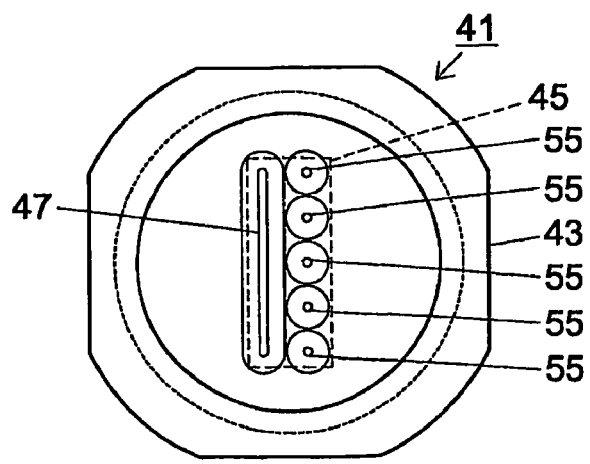

FIG. 7A, FIG. 7B and FIG. 7C are diagrams showing the composition of modifications of the resin ejection nozzle of the invention. In FIG. 7A to FIG. 7C, the elements which are essentially the same as corresponding elements in FIG. 5A are designated by the same reference numerals, and a description thereof will be omitted.

In the previous embodiment of FIG. 5A, the secondary ejection holes 49 for causing the encapsulation resin to contact the half area of the electronic part side are arranged in parallel to the slotted ejection hole 47 so that they have the longitudinal direction perpendicular to the direction of movement of the nozzle 41. The arrangement of the secondary ejection holes 49 may be varied according to the present invention.

As an alternative embodiment, the slotted ejection hole 47 and two secondary ejection holes 51 may be arranged such that the longitudinal directions of the secondary election holes 51 are slanted by about 45 degrees to the direction of movement of the nozzle 41, as shown in FIG. 7A. The secondary ejection holes 51 are located in the position adjacent to the side of the slotted ejection hole 47 which lies in the direction of movement of the nozzle 41. The length of each of the secondary ejection holes 51 is smaller than the length of the slotted ejection hole 47.

As another alternative embodiment, the slotted ejection hole 47 and four secondary ejection holes 53 may be arranged such that the longitudinal directions of the secondary election holes 53 are slanted by about 45 degrees to the direction of movement of the nozzle 41, as shown in FIG. 7B. The secondary ejection holes 53 are located in the position adjacent to the side of the slotted ejection hole 47 which lies in the direction of movement of the nozzle 41. The length of each of the secondary ejection holes 53 is still smaller than the length of the slotted ejection hole 47.

As another alternative embodiment, the slotted ejection hole 47 and a plurality of secondary ejection holes 55 which have a horizontal cross-section which is in the shape of a circle may be arranged as shown in FIG. 7C.

By scanning one of the resin ejection nozzles 41 of FIG. 7A-7C over the wiring substrate on which the electronic parts are mounted, the resin application can be carried out in the same manner as in the above-described resin encapsulation method of FIG. 3 or FIG. 6. The encapsulation resin ejected from the secondary ejection holes 51 (53 or 55) can be caused to contact the substantially half area of the electronic part side, and it is possible to obtain the advantages that are the same as those of the above-described resin ejection nozzle 41 of FIG. 5A.

In the above-mentioned embodiments of FIG. 5A and FIG. 7A-7C, the slotted ejection hole 47 may be replaced by the slotted ejection hole 7 in the embodiment of FIG. 1A which is formed so that the central part of the hole 7 in the longitudinal direction is curved to the direction of movement of the nozzle which direction is perpendicular to the longitudinal direction of the hole 7. Also in such modified embodiment, by scanning the resin ejection nozzle 41 over the wiring substrate on which the electronic parts are mounted, the resin application can be carried out in the same manner as in the above-described resin encapsulation method of FIG. 3 or FIG. 6. And it is possible for the modified embodiment to obtain the advantages that are the same as those of the above-described resin ejection nozzle 41 of FIG. 5A.

In the above-mentioned embodiments of FIG. 5A and FIG. 7A-7C, it is not necessarily required that the slotted ejection hole 47 and the secondary ejection holes 49, 51, 53 and 55 be tapered. Moreover, it is not necessarily required that the secondary ejection holes 49, 51, 53 and 55 be arranged such that the encapsulation resin ejected from the secondary ejection holes 49 is caused to contact the substantially half area of the electronic-part side of the wiring substrate.

The present invention is not limited to the above-described embodiments and variations and modifications may be made without departing from the scope of the invention.

For example, the electronic part assembly in the above-mentioned embodiments of the resin encapsulation method is the protection circuit module. However, the object of resin encapsulation method is not limited to the protection circuit module, and another electronic part assembly may be the object of the resin encapsulation method. Moreover, the object of resin encapsulation is not limited to the cluster board, and one wiring substrate may be the object of resin encapsulation.

The application of the resin ejection nozzle and the encapsulation resin method of the invention is not limited to the resin encapsulation of a wiring substrate, such as a printed-circuit board, and the resin ejection nozzle and the encapsulation resin method of the invention is also application to the resin encapsulation of a semiconductor chip mounted on the lead frame. Therefore, the electronic part assembly of the invention may include a semiconductor device in which the resin encapsulation is carried out.

It is not necessarily required that the width of the ejection part in the longitudinal direction of the resin ejection nozzle is slightly smaller than the width of the encapsulation area of the wiring substrate. What is necessary for the ejection part of the resin ejection nozzle is that the slotted ejection hole is a slot which has the longitudinal direction perpendicularly to the direction of movement of the nozzle.

What is meant by the direction of movement of the nozzle at the time of application of the encapsulation resin is the direction of relative movement of the nozzle to the wiring substrate. There are several cases of relative movement of the resin ejection nozzle to the wiring substrate. In one case, the wiring substrate is fixed and the resin ejection nozzle is moved relative to the wiring substrate. In another case, the resin ejection nozzle is fixed and the wiring substrate is moved to the nozzle. In another case, both the resin ejection nozzle and the wiring substrate are moved relative to each other.

Further, the present application is based on and claims the benefit of priority of Japanese patent application No. 2005-076215, filed on Mar. 17, 2005, the entire contents of which are hereby incorporated by reference.

The invention claimed is:

1. A resin encapsulation method which ejects an encapsulation resin to an encapsulation area of a substrate on which an electronic part is mounted, when a resin ejection nozzle is moved over the substrate, the resin encapsulation method comprising the steps of:
providing a resin ejection nozzle comprising an ejection hole part and an ejection part configured to eject the encapsulation resin, the ejection part having a longitudinal direction which is perpendicular to a direction of movement of the nozzle,
said ejection hole part including a slotted ejection hole;
causing the encapsulation resin to be ejected through the slotted ejection hole to contact a substantially half area of a side of the electronic part which lies at right angles to the direction of movement of the nozzle; and
causing the encapsulation resin to gradually contact a remaining area of the side of the electronic part after the substantially half area of the side of the electronic part is contacted by the encapsulation resin
wherein a plurality of secondary ejection holes are arranged adjacent to a side of the slotted ejection hole which lies in the direction of movement of the nozzle, the plurality of secondary ejection holes causing the encapsulation resin to contact the substantially half area of the side of the electronic part which lies at right angles to the direction of movement of the nozzle,
the plurality of secondary ejection holes being arranged such that the encapsulation resin from each secondary ejection hole is caused to contact the substantially half area of the side of the electronic part.

2. The resin encapsulation method according to claim 1, wherein the resin ejection nozzle is scanned in a transverse direction that is perpendicular to the longitudinal direction of the ejection part, over the encapsulation area, while the encapsulation resin is ejected through the slotted ejection hole.

3. A resin ejection nozzle which is moved over a substrate on which an electronic part is mounted, and ejects an encapsulation resin to an encapsulation area of the substrate, the resin ejection nozzle comprising:
an ejection part configured to eject the encapsulation resin, the ejection part having a longitudinal direction which is perpendicular to a direction of movement of the nozzle; and
an ejection hole part configured to cause the encapsulation resin to contact a substantially half area of a side of the electronic part which lies at right angles to the direction of movement of the nozzle, said ejection hole part including a slotted ejection hole,
wherein a plurality of secondary ejection holes are arranged adjacent to a side of the slotted ejection hole which lies in the direction of movement of the nozzle, the plurality of secondary ejection holes causing the encapsulation resin to contact the substantially half area of the side of the electronic part which lies at right angles to the direction of movement of the nozzle, and
wherein a remaining area of the side of the electronic part is gradually contacted by the encapsulation resin after the substantially half area of the side of the electronic part is contacted by the encapsulation resin.

4. The resin ejection nozzle according to claim 3 wherein each of the plurality of secondary ejection holes is configured so that a width of each of the plurality of secondary ejection holes in a longitudinal direction of each secondary ejection hole is smaller than a width of the slotted ejection hole in a longitudinal direction, and the longitudinal direction of each secondary ejection hole is slanted to the direction of movement of the nozzle.

5. The resin ejection nozzle according to claim 3 wherein the plurality of secondary ejection holes are arranged such that the encapsulation resin from each secondary ejection hole is caused to contact the substantially half area of the side of the electronic part.

* * * * *

UNITED STATES PATENT AND TRADEMARK OFFICE
CERTIFICATE OF CORRECTION

| | | |
|---|---|---|
| PATENT NO. | : 8,148,209 B2 | Page 1 of 1 |
| APPLICATION NO. | : 11/587063 | |
| DATED | : April 3, 2012 | |
| INVENTOR(S) | : Seiichi Morishita | |

It is certified that error appears in the above-identified patent and that said Letters Patent is hereby corrected as shown below:

Title Page

Replace Item (86) with the following:

--(86)   PCT No.:   PCT/JP2006/305471--

Signed and Sealed this
Twenty-eighth Day of August, 2012

David J. Kappos
*Director of the United States Patent and Trademark Office*